US006984574B2

(12) United States Patent
Fortin et al.

(10) Patent No.: US 6,984,574 B2
(45) Date of Patent: Jan. 10, 2006

(54) COBALT SILICIDE FABRICATION USING PROTECTIVE TITANIUM

(75) Inventors: Vincent Fortin, Santa Clara, CA (US); Kuei-Chang Tsai, San Jose, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 10/056,154

(22) Filed: Jan. 23, 2002

(65) Prior Publication Data

US 2003/0148606 A1 Aug. 7, 2003

(51) Int. Cl.
*H01L 21/425* (2006.01)
(52) U.S. Cl. .................. 438/533; 438/583; 438/586; 438/649; 438/655; 438/682
(58) Field of Classification Search ............ 438/533, 438/583, 586, 649, 655, 664, 682, 683; 257/754, 257/755, 757, 768, 769
See application file for complete search history.

(56) References Cited

U.S. PATENT DOCUMENTS

| 5,178,739 | A | | 1/1993 | Barnes et al. ............. 204/192.12 |
| 5,569,363 | A | | 10/1996 | Bayer et al. ............. 204/192.32 |
| 5,863,598 | A | * | 1/1999 | Venkatesan et al. ........... 427/97 |
| 6,093,966 | A | * | 7/2000 | Venkatraman et al. ....... 257/751 |
| 6,136,705 | A | * | 10/2000 | Blair ........................ 438/682 |
| 6,168,696 | B1 | * | 1/2001 | Burton et al. ........... 204/298.06 |
| 6,268,284 | B1 | * | 7/2001 | Cerio ........................ 438/643 |
| 6,329,277 | B1 | * | 12/2001 | Liu et al. .................... 438/612 |
| 6,337,245 | B1 | * | 1/2002 | Choi ........................ 438/258 |
| 6,342,133 | B2 | * | 1/2002 | D'Couto et al. ........ 204/192.17 |
| 6,355,524 | B1 | | 3/2002 | Tuan et al. ................. 438/257 |
| 6,392,302 | B1 | * | 5/2002 | Hu ........................... 257/775 |
| 6,458,252 | B1 | * | 10/2002 | Russell ................. 204/192.12 |
| 6,503,824 | B1 | * | 1/2003 | Fortin ....................... 438/622 |
| 6,696,360 | B2 | * | 2/2004 | Ahn et al. .................. 438/632 |
| 2001/0002712 | A1 | * | 6/2001 | Horiguchi et al. .......... 257/315 |
| 2002/0001946 | A1 | * | 1/2002 | Lee .......................... 438/656 |
| 2002/0019127 | A1 | * | 2/2002 | Givens ..................... 438/637 |
| 2002/0132473 | A1 | * | 9/2002 | Chiang et al. .............. 438/643 |

OTHER PUBLICATIONS

"Handbook of Semiconductor Manufacturing Technology" (2000), edited by Y. Nishi et al., pp. 395-413.
H. Li et al., "Gaseous Impurities in Co Silicidation", Journal of The Electrochemical Society, 148 (6) G344-G354 (2001).
S. Wolf, "Silicon Processing for the VLSI Era", vol. 2 (1990), p. 246.
S.P. Muraka, "Self-aligned silicides or metals for very large scale integrated circuit applications", J. Vac. Sci. Technol. B 4 (6), Nov./Dec. 1986, pp. 1325-1331.
G.L. Miles et al., "TiSi$_2$ phase transformation characteristics on narrow devices", Thin Solid Films 290-291 (1996), pp. 469-472.

(Continued)

*Primary Examiner*—Hsien Ming Lee
(74) *Attorney, Agent, or Firm*—Ronald J. Meetin

(57) ABSTRACT

A cobalt silicide fabrication process entails first depositing a cobalt layer (120) on a silicon-containing EPROM region. A titanium layer (130) is formed over the cobalt layer by ionized physical vapor deposition ("IPVD") to protect the cobalt layer from contaminant gases. Cobalt of the cobalt layer is reacted with silicon of the EPROM region to form a cobalt silicide layer (210) after which the titanium layer and any unreacted cobalt are removed. Use of IPVD to form the titanium layer by improves the step coverage to produce a better cobalt silicide layer.

38 Claims, 4 Drawing Sheets

OTHER PUBLICATIONS

J.P. Gambino et al., "Silicides and ohmic contacts", Materials Chemistry and Physics 52 (1998), pp. 99-146.

Kang et al., "The Leakage Current Improvement in an Ultrashallow Junction NMOS with Co Silicided Source and Drain", IEEE Electron Device Letters, vol. 21, No. 1, (Jan. 2000), pp. 9-11.

H.J. Barth et al., "Advanced PVD Ti/TiN lines for contact and via applications", Proceedings of SPIE, vol. 3214 (1997), pp. 2-11.

"Applied Metrials Launches Advanced Cobalt Solution for Nano-Chip Manufacturing", Santa Clara, Calif. (Business Wire), http://www.businesswire.com/cgi-bin/cnnisplay.cgi?... Dec. 4, 2001 (1 page).

J.B. Lasky et al., "Comparison of Transformation to Low-Resistivity Phase and Agglomeration of $TiSi_2$ and $CoSi_2$", IEEE Transactions on Electron Devices, vol. 38, No. 2, Feb. 1991, pp. 262-269.

"Liner/Barrier & Tungsten ", http://www.appliedmaterials.com/products/ism_liner.html, Jan. 16, 2002 (4 pages).

Hopwood, "Ionized physical vapor deposition of integrated circuit interconnects", *Physics of Plasmas*, May 1998, pp. 1624-1631.

"Applied Materials Launches Advanced Cobalt Solution for Nano-Chip Manufacturing", Business Wire, Applied Materials, http://www.businesswire.com/cgi-bin/cnn-storydisplay.cgi?story=www/between/webboc/bw.1204...1, Dec. 4, 2001, 1 page.

* cited by examiner

COBALT SILICIDE FABRICATION USING PROTECTIVE TITANIUM

BACKGROUND OF THE INVENTION

The present invention relates to formation of cobalt silicide on a silicon surface.

Cobalt silicide has been used to reduce the resistance of transistor gates and source/drain regions in silicon integrated circuits. Cobalt silicide can be formed in a self-aligned manner by a "salicide" (self-aligned silicide) process illustrated in FIGS. 1 and 2. These figures show a polysilicon gate 100 and source/drain regions 101 of a MOS transistor fabricated in a wafer 102. The source/drain regions 101 are doped regions of a monocrystalline silicon substrate 104. Gate dielectric 108 separates the gate 100 from the substrate. Dielectric spacers 110 cover the sidewalls of gate 100.

A cobalt layer 120 is sputtered over the structure. A titanium layer 130 is sputtered on cobalt 120 to protect the cobalt layer from oxygen and other impurities during subsequent processing. Then the wafer is heated (in a rapid thermal processing step, or RTP) to react cobalt 120 with the silicon at the top of gate 100 and on source/drain regions 101. A cobalt silicide layer 210 (FIG. 2) forms as a result. This layer may include cobalt monosilicide CoSi and cobalt disilicide $CoSi_2$. Titanium 130 and the unreacted cobalt are removed with a wet etch. The wafer is heated again to increase the proportion of cobalt disilicide $CoSi_2$ in layer 210 and thus reduce the layer 210 resistivity. See H. Li et al., "Gaseous Impurities in Co Silicidation", Journal of The Electrochemical Society, 148 (6) G344–G354 (2001), incorporated herein by reference.

In addition to protecting the cobalt layer 120 from impurities, some of titanium 130 may diffuse to the cobalt/silicon interface and dissolve the native silicon oxide, thus allowing the cobalt silicide to form (the cobalt itself does not dissolve the native oxide).

The cobalt salicide process has been suggested for silicidation of silicon surfaces at the bottom of openings formed in dielectric layers deposited over silicon. When cobalt 120 is deposited in the openings, a good step coverage is needed in order to have a sufficient cobalt thickness at the bottom of the openings and thus achieve low cobalt silicide resistivity. As the integrated circuit technology is scaled down to smaller line widths, the aspect ratios of the openings tend to increase, and achieving a good step coverage of the cobalt film becomes increasingly difficult. Applied Materials, Inc. has announced that its Endura® ALPS™ (Advanced Low Pressure Source) cobalt deposition chamber can provide greater than 10% bottom coverage in 6:1 aspect ratio contact openings. Further improvements in the cobalt silicide fabrication are desirable.

SUMMARY

The invention is defined by the appended claims which are incorporated into this section in their entirety. The rest of this section summarizes some features of the invention.

The inventors have observed that the cobalt salicide process needs not only a good step coverage of cobalt 120 but also a good step coverage of titanium 130. FIG. 3 illustrates an opening 310 formed in dielectric 320 over substrate 104. Cobalt 120 and titanium 130 have been deposited over the dielectric as in FIG. 1. Titanium 130 has to be sufficiently thick to protect the cobalt 120 from the gaseous impurities. If the titanium step coverage is poor, i.e. the titanium is thinned in bottom corners 310C, then the titanium thickness T as measured over the non-stepped surfaces has to be increased. If the step coverage is good, the titanium thickness can be less, resulting in a better process control and lower "cost of ownership" (overall manufacturing cost).

In some embodiments of the invention, the titanium is deposited by ionized physical vapor deposition ("ionized PVD"). An ionized PVD chamber includes an induction coil positioned between the titanium target and the wafer. The coil is energized with an AC current to densify the plasma in the chamber. As the sputtered titanium atoms move towards the wafer, some of the titanium atoms become ionized due to the coil energy. The pedestal holding the wafer is also biased with an AC current to attract the titanium ions and cause them to approach the wafer at an angle closer to 90°. See "Handbook of Semiconductor Manufacturing Technology" (edited by Yoshio Nishi et al., 2000), pages 406–407, incorporated herein by reference. Better step coverage is achieved at the bottom of the openings because the ions approaching the wafer at the angles near 90° are less likely to create overhangs near the top of the openings.

In some embodiments of the invention, however, the wafer holding pedestal bias is turned off to reduce cobalt resputtering and thus achieve a lower cobalt silicide resistance.

Also, in some embodiments, the titanium deposition is performed in a medium or long throw chamber (the throw is the distance between the titanium target and the wafer). In some embodiments, the throw is at least 140 mm. Better step coverage is achieved because the titanium atoms and ions reaching the wafer are more likely to be closer to normal incidence. See "Handbook of Semiconductor Manufacturing Technology" (edited by Yoshio Nishi et al., 2000), page 402, incorporated herein by reference.

Other features of the invention are described below. The invention is defined by the appended claims.

DESCRIPTION OF SOME EMBODIMENTS

The examples in this section are provided for illustration and not to limit the invention. The invention is not limited to particular deposition parameters, processes, equipment, thickness values or other dimensions, except as defined by the claims.

In one example, cobalt silicide is formed using a cluster tool of type Endura 5500 available from Applied Materials, Inc. of Santa Clara, Calif. Optionally, prior to loading the wafers in the Endura tool, a 100:1 HF wet clean can be performed on the wafers to remove the native silicon oxide. In the Endura system, the wafers are submitted to a degas step followed by a sputter-etch step in RF argon plasma to remove the native oxide. The HF cleaning step and the sputter-etch step can be omitted (the native oxide tends to be dissolved by the titanium atoms diffusing through the cobalt layer) or can be replaced with other cleaning steps.

Then cobalt is deposited in the Endura cluster tool in a chamber of type ALPS™ (Advanced Low Pressure Source) available from Applied Materials, Inc. An exemplary cobalt thickness is 20 nm or 40 nm, and other thickness values can also be used. The deposition parameters and some properties of the resulting cobalt film are given in Table 1. The cobalt film properties were actually obtained for the 20 nm cobalt thickness.

TABLE 1

| Target to Wafer Spacing | about 190 mm |
| Target Power | about 2 Kw |
| Chamber Pressure | below 1.0 mTorr |
| Wafer Chuck Temperature | room temperature |

Figure 1:
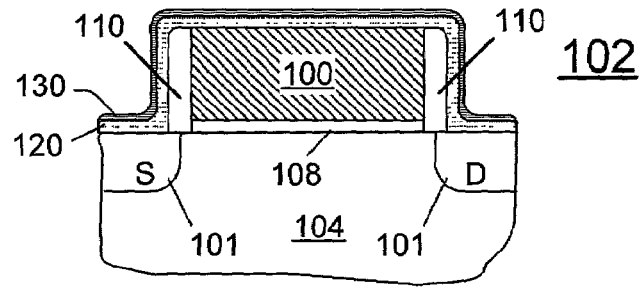
FIGS. 1–3 are cross section illustrations of prior art semiconductor structures.
Figure 2:
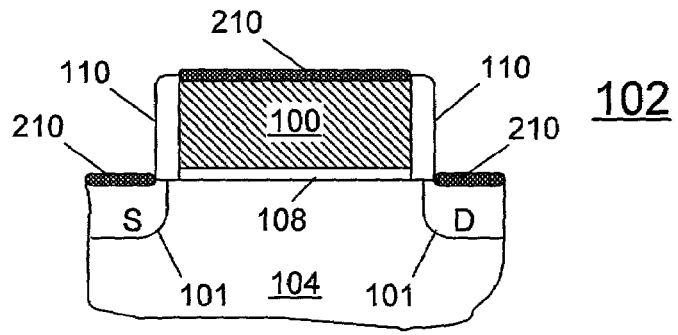
Figure 3:
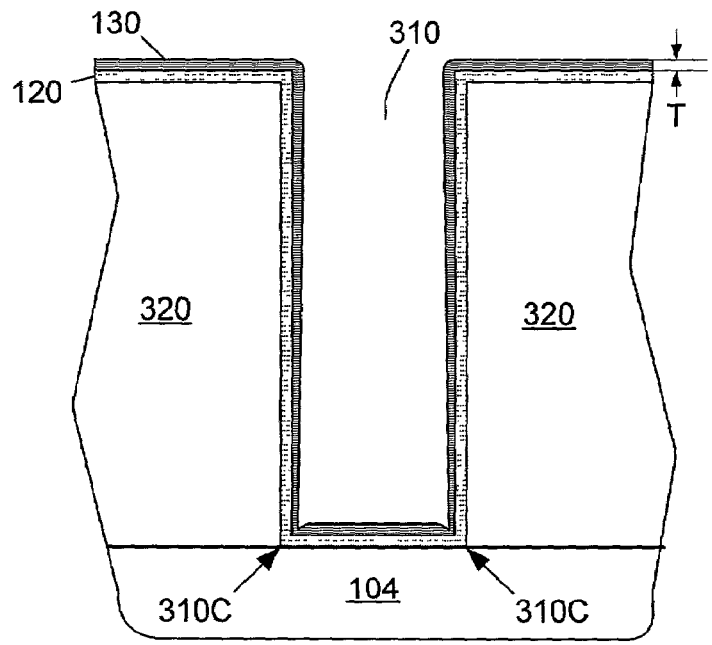
Figure 4:
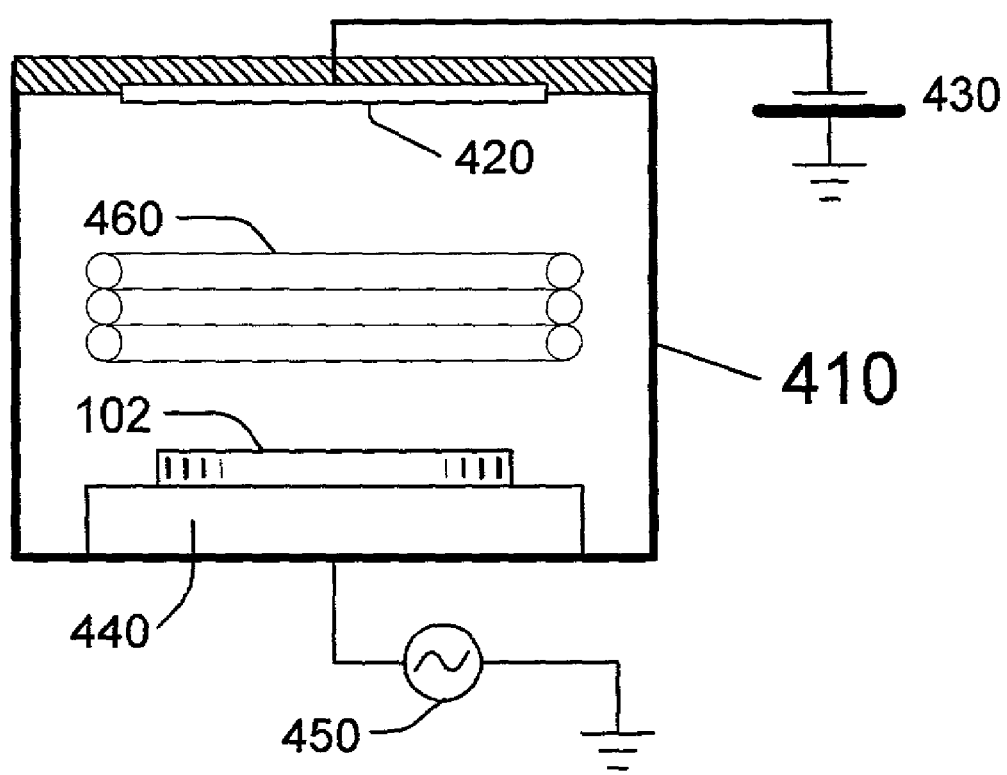
FIG. 4 shows a cross section of an ionized PVD chamber suitable for forming cobalt silicide according to some embodiments of the present invention.

Then titanium layer 130 is deposited by ionized PVD. In some embodiments, the titanium is deposited in-situ, without breaking the vacuum after the cobalt deposition and without unloading the wafer from the Endura cluster tool, and the deposition is performed in a medium throw magnetron IMP (ion metal plasma) chamber 410 (FIG. 4) of type Vectra available as part of the Endura tool. Titanium target 420 is shown mounted at the top of chamber 410. Target 420 is connected to a negative DC bias source 430. Wafer 102 is placed on a metallic pedestal 440. Bias source 450 biases the pedestal with an AC current of a frequency 13.56 MHz. Argon is flowed into the chamber. Bias source 430 helps ionize the argon. Coil 460 generates an RF electromagnetic field to densify the argon plasma, making the plasma high density. The argon ions dislodge titanium atoms from target 420. Some of the titanium atoms become ionized by the high density plasma. The titanium atoms and ions settle on wafer 102. See "Handbook of Semiconductor Manufacturing Technology" (edited by Yoshio Nishi et al., 2000), pages 395–413, incorporated herein by reference.

The throw distance (the distance between target 420 and wafer 102) is 140 mm.

In some embodiments, the titanium is deposited with the AC pedestal bias turned off (0 W). Other deposition parameters can be as follows:

TABLE 2

| DC power on target (source 430) | 2 kW |
| RF power (coil 460) | 2.5 kW |
| AC pedestal bias (source 450) | 0 W |
| DC voltage at the pedestal | 0 V |
| Pressure in chamber 410 | 18 mTorr |
| Argon flow | 60 sccm |
| Temperature in chamber 410 | 200° C. |

An exemplary thickness of titanium layer 130 is 7.5 nm or less. Thickness above 7.5 nm, for example, 15 nm or 25 nm, can also be used.

Then the wafer is unloaded from the Endura tool and annealed in a Rapid Thermal Annealing (RTA) system to form cobalt silicide. In one example, the anneal involves holding the wafer at 550° C. for 30 seconds in a nitrogen atmosphere. The nitrogen flow is 5 slm (standard liters per minute). Suitable equipment is HEATPULSE 8800 available from AG Associates, Inc., of San Jose, Calif. Other equipment and anneal parameters can also be used.

The anneal is followed by selective wet strips of the titanium 130 and the unreacted cobalt. In one example, the titanium is stripped by a 5 minute etch in a solution consisting of 1 part of $NH_4OH$, 1 part of $H_2O_2$, and 2 parts of water. The cobalt is stripped by a 5 minute etch in a solution of 10 parts of $H_2SO_4$ and 1 part of $H_2O_2$. Finally, the wafers are subjected to another RTA step (e.g. 30 seconds at 800° C. with a nitrogen flow of 5 slm in a HEATPULSE 8800 chamber) to form the low-resistivity $CoSi_2$ phase. The above wet etch and anneal parameters are exemplary and not limiting.

Figure 5:
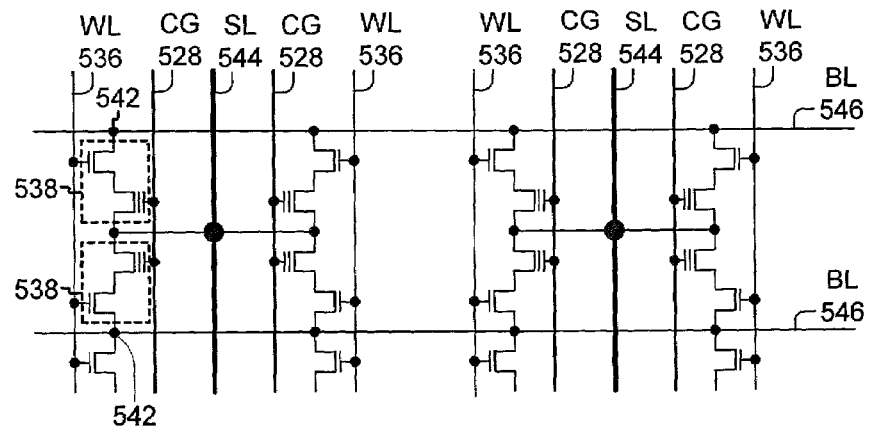
FIG. 5 is a circuit diagram of a memory array fabricated according to one embodiment of the present invention.
Figure 6:
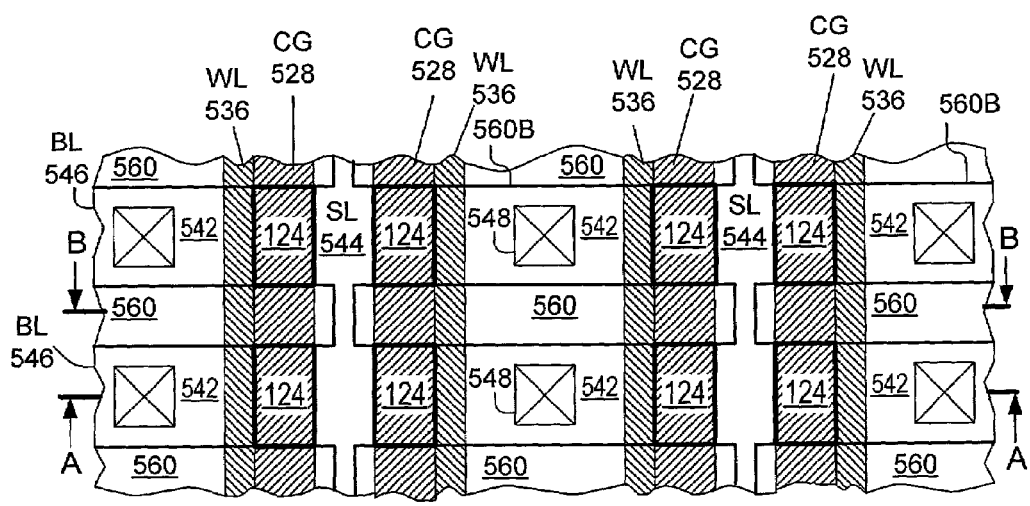
FIG. 6 is a top view of the array of FIG. 5.

In one example, cobalt suicide is formed on the source lines of a flash memory array illustrated in FIGS. 5–8. Some features of this memory are described in U.S. Pat. application Ser. No. 09/640,139 filed Aug. 15, 2000 by Hsing Tuan et al., entitled "Nonvolatile Memory Structures and Fabrication Methods", incorporated herein by reference (now U.S. Pat. No. 6,355,524 issued Mar. 12, 2002). FIG. 5 is a circuit diagram showing two columns of the array. FIG. 6 is a top view. FIG. 7A illustrates a cross section of the array along the line A—A in FIG. 6. FIG. 7B illustrates a cross section along the line B—B.

Figure 7A:
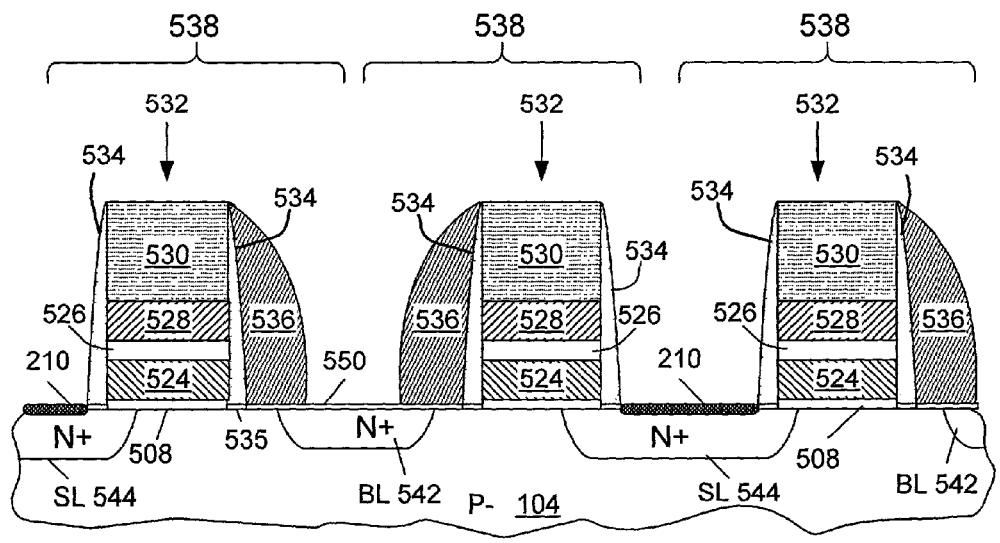
FIGS. 7A, 7B show vertical cross sections of the array of FIG. 5.
Figure 7B:
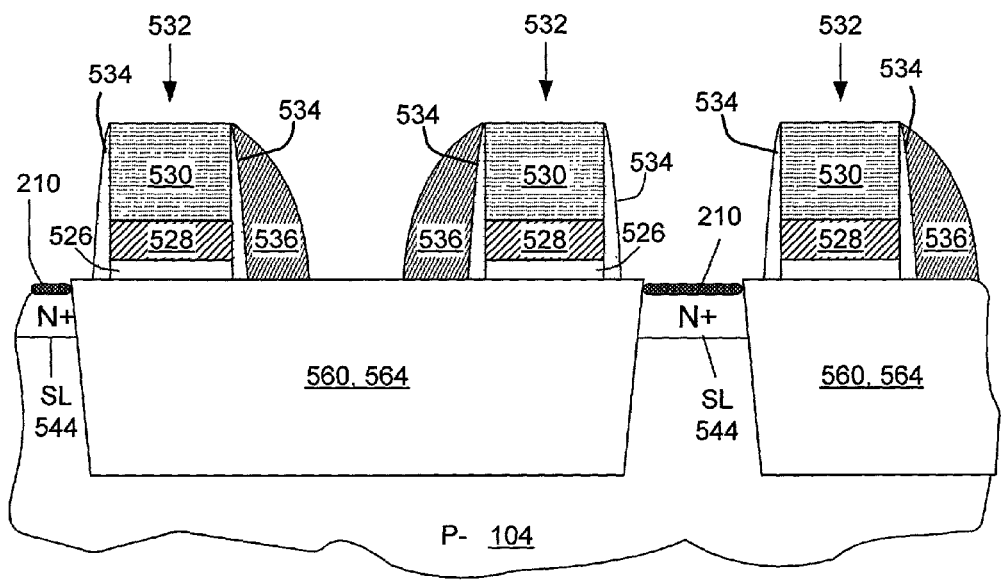

The array is fabricated over a P-type doped region of a monocrystalline silicon substrate 104 (FIGS. 7A, 7B). Silicon dioxide 508 ("tunnel oxide") is formed on substrate 104. Polysilicon floating gates 524 are formed on oxide 508.

Dielectric 526 (FIGS. 7A, 7B) separates the floating gates from control gates 528. In each memory row, the control gates are provided by a line of doped polysilicon ("control gate line"). The control gate lines are referenced as 528, like the individual control gates. Control gate lines 528 are vertical lines in FIGS. 5 and 6.

Silicon nitride 530 overlies control gate lines 528. Oxide 508, polysilicon 524, dielectric 526, control gate lines 528, and silicon nitride 530 form a stack 532 in each row of the array. Each stack 532 traverses the entire array, except that the floating gates 524 of different memory cells are separated from each other.

Dielectric 534 (FIGS. 7A, 7B) on the sidewalls of stacks 532 insulates the control and floating gates from polysilicon wordlines 536. In some embodiments, dielectric 534 includes silicon dioxide (not separately shown) formed on the sidewalls of polysilicon 524, 528, and also includes an outer layer consisting of silicon nitride spacers which overlie the silicon dioxide. A thin silicon dioxide layer 535 (FIG. 7A) is formed on the substrate under the dielectric 534.

Each wordline 536 is a spacer on a sidewall of a stack 532. Each wordline runs vertically in the view of FIGS. 5 and 6 and provides select gates for one row of the array.

Each memory cell 538 has source/drain regions 542, 544 in substrate 104 (FIGS. 5, 7A). Region 542 ("bitline region") is adjacent to select gate 536 and is connected to a bitline 546 (FIGS. 5, 6). The bitlines go over the control gate lines 528, silicon nitride 530, and wordlines 536. Each column of the memory cells is connected to one bitline. Each bitline region 542 is shared by two memory cells in adjacent rows. Bitline regions 542 are connected to the bitlines by contacts 548. Each contact is a conductive structure that passes through one or more dielectric layers (not shown).

A thin silicon dioxide layer 550 is shown to overlie the bitline regions 542. This layer is removed during the formation of the contact openings for contacts 548.

Regions 544 ("source line regions") are formed on the opposite side of each stack 532 from regions 542. Two adjacent rows have their regions 544 merged into a contiguous diffused "source line" that transverses the array between two respective stacks 532.

Cobalt silicide 210 is formed on source lines 544 by any of the processes described above. Cobalt silicide 210 can also be formed on wordlines 536. Alternatively, the wordlines can be covered by a dielectric (not shown) during the cobalt deposition, so cobalt silicide will not form on the wordlines.

Isolation trenches 560 (FIGS. 6 and 7B) in substrate 104 are filed with dielectric 564 ("field oxide"), which is silicon dioxide in some embodiments. Dielectric 564 provides isolation between the active areas of the memory array. The trench boundaries are shown at 560B in FIG. 6. The trenches extend in the bitline direction between adjacent source lines 544. Each trench 560 passes under two rows of the array and projects from under the respective control gate lines 528 into the source lines.

In FIG. 5, each cell 538 is schematically represented as an NMOS transistor and a floating gate transistor connected in series. Each row of memory cells has two cells 538 between each two adjacent bitlines 546.

Exemplary voltages for the programming, erase and reading operations of the memory are described in the aforementioned U.S. Pat. No. 6,355,524.

In some embodiments, the height of each stack 532 is about 0.48 $\mu$m in the cross section of FIG. 7A. Each cobalt silicide line 210 extends between two dielectric features 534. The width of each line 210 in the cross section of FIG. 7A is about 0.30 $\mu$m to 0.38 $\mu$m. The aspect ratio of the opening into which the cobalt and titanium layers are deposited during the fabrication of cobalt silicide 210 (the opening between adjacent stacks 532) is thus about 1.3 to 1.6. The width of each dielectric feature 534 at the bottom is about 0.02 $\mu$m to 0.06 $\mu$m.

In the cross section of FIG. 7B, the height of each stack 532 is about 0.3 $\mu$m. The width of the cobalt silicide line 210 is about 0.13 $\mu$m to 0.21 $\mu$m. The width of each dielectric feature 534 at the bottom is about 0.02 $\mu$m to 0.06 $\mu$m.

These dimensions are exemplary and not limiting. Cobalt silicide can be formed in openings having any aspect ratios. Aspect ratios of 2.5, 2.6 and higher are being considered and are not limiting. The invention is not limited by the particular materials, circuits, dimensions, and process parameters described above. For example, the invention is not limited to memories or to the use of silicon dioxide or silicon nitride insulators. The invention is defined by the appended claims.

What is claimed is:

1. A method comprising:
   forming a cobalt layer over a body which comprises a silicon-containing erasable programmable read-only memory region;
   forming a titanium layer over the cobalt layer by ionized physical vapor deposition;
   reacting cobalt of the cobalt layer with silicon of a doped silicon section of the erasable programmable read-only memory region to form a cobalt silicide layer; and
   substantially removing the titanium layer and any unreacted cobalt of the cobalt layer.

2. The method of claim 1 wherein the doped silicon section comprises doped monocrystalline silicon.

3. The method of claim 1 further including, subsequent to the removing act, heating the body and cobalt silicide layer to reduce the resistivity of the cobalt silicide layer.

4. The method of claim 3 wherein the heating act comprises rapidly thermally annealing the body and cobalt silicide layer.

5. The method of claim 1 wherein the forming acts are performed in a chamber at below-atmospheric pressure without exposing the body to atmospheric pressure between the forming acts.

6. The method of claim 1 wherein the titanium layer has a thickness of no more than 7.5 $\mu$m.

7. The method of claim 1 wherein the ionized physical vapor deposition is performed in a chamber with the body situated on a pedestal coupled to a bias source that provides AC current for helping ionize gas to produce gas ions that dislodge titanium from a titanium target in the chamber.

8. The method of claim 1 wherein the ionized physical vapor deposition is performed in a chamber with the body situated on a pedestal coupled to a bias source that is turned substantially off to reduce resputtering of cobalt of the cobalt layer.

9. The method of claim 1 wherein:
   the body includes a silicon oxide layer extending along the doped silicon section;
   the method includes, prior to the forming acts, removing at least part of the silicon oxide layer to substantially expose at least part of the doped silicon section; and
   at least part of the cobalt layer is formed along the doped silicon section where it is substantially exposed.

10. The method of claim 1 wherein:
    the body includes a silicon oxide layer situated along the doped silicon section; and
    the reacting act includes causing oxygen in the silicon oxide layer to be dissolved by titanium of the titanium layer.

11. A method comprising:
    forming a cobalt layer over a body which comprises an erasable programmable read-only memory region that includes (i) a first section comprising doped monocrystalline silicon and (ii) a second section situated on the first section, an opening extending through the second section down to the first section;
    forming a titanium layer over the cobalt layer by ionized physical vapor deposition;
    reacting cobalt of the cobalt layer with silicon of the first section to form a cobalt silicide layer that contacts remaining material of the first section at the bottom of the opening; and
    substantially removing the titanium layer and any unreacted cobalt of the cobalt layer.

12. The method of claim 11 wherein the first section is a surface layer of the erasable programmable read-only memory region.

13. The method of claim 11 wherein the titanium layer is formed to extend at least into the opening so as to overlie cobalt of the cobalt layer at the bottom of the opening.

14. The method of claim 13 wherein:
    the first section comprises (a) a substrate region consisting largely of silicon and (b) a silicon oxide layer extending along the silicon substrate region at least at the bottom of the opening;
    the method includes, prior to the forming acts, removing part of the silicon oxide layer at the bottom of the opening to substantially expose the silicon substrate region at the bottom of the opening; and
    at least part of the cobalt layer is formed along the silicon substrate region at the bottom of the opening.

15. The method of claim 13 wherein:
    the first section comprises (a) a substrate region consisting largely of silicon and (b) a silicon oxide layer extending along the silicon substrate region at least at the bottom of the opening; and
    the reacting act includes causing oxygen of the silicon oxide layer at the bottom of the opening to be dissolved by titanium of the titanium layer.

16. A method comprising:
    forming a cobalt layer over a body which comprises (a) a doped monocrystalline silicon substrate, (b) a floating gate overlying the substrate, (c) a control gate overlying the floating gate, and (d) electrically insulating material which surrounds the floating gate and separates the floating and control gates from each other and from the substrate;

forming a titanium layer over the cobalt layer by ionized physical vapor deposition;

reacting cobalt of the cobalt layer with silicon of the substrate to form a cobalt silicide layer that contacts remaining material of the substrate; and substantially removing the titanium layer and any unreacted cobalt of the cobalt layer.

17. The method of claim 16 wherein:
the substrate comprises a pair of source/drain regions and a body region that (a) separates the source/drain regions from each other and (b) forms a pn junction with each source/drain region, the floating gate extending partially over at least one of the source/drain regions;
the cobalt silicide layer is formed to contact one of the source/drain regions.

18. The method of claim 17 wherein a floating-gate transistor of a memory cell of an erasable programmable read-only memory is comprised of the source/drain and body regions and the floating and control gates.

19. The method of claim 17 wherein the floating gate extends partially over only one of the source/drain regions.

20. The method of claim 17 further including:
forming a further cobalt layer over the other of the source/drain regions;
forming a further titanium layer over the further cobalt layer by ionized physical vapor deposition;
reacting cobalt of the further cobalt layer with silicon of that other of the source/drain regions to form a further cobalt silicide layer; and
substantially removing the further titanium layer and any unreacted cobalt of the further cobalt layer.

21. The method of claim 16 wherein the body includes (a) a select gate overlying the substrate generally lateral to the floating gate and (b) electrically insulating material which separates the select gate from the floating and control gates and from the substrate.

22. The method of claim 21 wherein:
the substrate comprises a pair of source/drain regions and a body region that (a) separates the source/drain regions from each other and (b) forms a pn junction with each source/drain region, the floating gate extending partially over one of the source/drain regions, the select gate extending partially over the other of the source/drain regions; and
the cobalt silicide layer is formed to contact one of the source/drain regions.

23. The method of claim 22 wherein a floating-gate transistor of a memory cell of an erasable programmable read-only memory is comprised of the source/drain and body regions and the floating, control, and select gates.

24. The method of claim 22 further including:
forming a further cobalt layer over the other of the source/drain regions;
forming a further titanium layer over the further cobalt layer by ionized physical vapor deposition;
reacting cobalt of the further cobalt layer with silicon of that other of the source/drain regions to form a further cobalt silicide layer; and
substantially removing the further titanium layer and any unreacted cobalt of the further cobalt layer.

25. The method of claim 16 further including, subsequent to the removing act, heating the body and cobalt silicide layer to reduce the resistivity of the cobalt silicide layer.

26. The method of claim 25 wherein the heating act comprises rapidly thermally annealing the body and cobalt silicide layer.

27. The method of claim 16 wherein the forming acts are performed in a chamber at below-atmospheric pressure without exposing the body to atmospheric pressure between the forming acts.

28. The method of claim 16 wherein the titanium layer has a thickness of no more than 7.5 $\mu$m.

29. The method of claim 16 wherein the ionized physical vapor deposition comprises ion sputtering from a titanium target at a throw distance of at least 140 nm to the body.

30. The method of claim 16 wherein the ionized physical vapor deposition is performed in a chamber with the body situated on a pedestal coupled to a bias source that provides AC current for helping ionize gas to produce gas ions that dislodge titanium from a titanium target in the chamber.

31. The method of claim 16 wherein the ionized physical vapor deposition is performed in a chamber with the body situated on a pedestal coupled to a bias source that is turned substantially off to reduce resputtering of cobalt of the cobalt layer.

32. The method of claim 16 wherein:
the body includes a silicon oxide layer extending along the substrate;
the method includes, prior to the forming acts, removing at least part of the silicon oxide layer to substantially expose at least part of the substrate; and
at least part of the cobalt layer is formed along the substrate where it is substantially exposed.

33. The method of claim 16 wherein:
the body includes a silicon oxide layer situated along the substrate; and
the reacting act includes causing oxygen in the silicon oxide layer to be dissolved by titanium of the titanium layer.

34. The method of claim 16 wherein:
the body includes an electrode-containing region situated on the substrate, an opening extending through the electrode-containing region down to the substrate;
the cobalt layer extends at least into the opening down to the substrate; and
the titanium layer extends at least into the opening so as to overlie cobalt of the cobalt layer at the bottom of the opening.

35. The method of claim 34 wherein:
the body further includes a silicon oxide layer extending along the substrate at least at the bottom of the opening;
the method includes, prior to the forming acts, removing part of the silicon oxide layer at the bottom of the opening to substantially expose the substrate at the bottom of the opening; and
at least part of the cobalt layer is formed along the substrate at the bottom of the opening.

36. The method of claim 34 wherein:
the body further includes a silicon oxide layer extending along the substrate at least at the bottom of the opening; and
the reacting act includes causing oxygen of the silicon oxide layer at the bottom of the opening to be dissolved by titanium of the titanium layer.

37. The method of claim 34 wherein the opening has an aspect ratio of at least 1.3.

38. The method of claim 34 wherein the opening has an aspect ratio of at least 2.5.

* * * * *